(12) United States Patent
Darmawikarta et al.

(10) Patent No.: US 12,740,442 B2
(45) Date of Patent: Sep. 15, 2026

(54) VIA STRUCTURE FOR EMBEDDED COMPONENT AND METHOD FOR MAKING SAME

(71) Applicant: Intel Corporation, Santa Clara, CA (US)

(72) Inventors: Kristof Darmawikarta, Chandler, AZ (US); Srinivas V. Pietambaram, Chandler, AZ (US); Haobo Chen, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 181 days.

(21) Appl. No.: 17/752,941

(22) Filed: May 25, 2022

(65) Prior Publication Data

US 2023/0387027 A1 Nov. 30, 2023

(51) Int. Cl.

*H10W 70/60* (2026.01)
*H10W 70/63* (2026.01)
*H10W 74/10* (2026.01)
*H10W 90/00* (2026.01)
*H10P 72/70* (2026.01)

(52) U.S. Cl.

CPC ........ *H10W 70/611* (2026.01); *H10W 70/635* (2026.01); *H10W 74/117* (2026.01); *H10W 90/00* (2026.01); *H10P 72/743* (2026.01); *H10W 90/724* (2026.01)

(58) Field of Classification Search

CPC ............. H01L 23/5384; H01L 23/3128; H01L 24/16; H01L 25/0655; H01L 2221/68359; H01L 2224/16227; H01L 23/15; H01L 23/5383; H01L 25/16; H01L 25/18; H01L 25/50

See application file for complete search history.

(56) References Cited

U.S. PATENT DOCUMENTS 9,812,426 B1 * 11/2017 Wang ...................... H01L 24/19

* cited by examiner

*Primary Examiner* — Elias Ullah
(74) *Attorney, Agent, or Firm* — Alliance IP, LLC

(57) ABSTRACT

A via structure for an embedded component and method for making same. The via structure includes a pillar of conductive material perpendicularly attached to a surface of a build-up dielectric layer. The surface and the pillar are conformally covered by a film layer. The film layer is conformally applied and retains a feature landscape profile. A dielectric layer is located on the film layer, the dielectric layer has an upper dielectric surface that is planar. The pillar has a top that is exposed at the upper dielectric surface. The film layer can act as a barrier to cracking because it is selected to have a higher hardness than the material making up the dielectric layer.

25 Claims, 11 Drawing Sheets

200
208
216
204
206
212
270
228
104
275
268
295
248
260
266
220
252
232
226
236
244
240
224
210
256
264
z
x 275
212
290
270
292
288
268
220
248
286
252 z
x
400
402
404
314
308
309
312
304
306
310
307
302

VIA STRUCTURE FOR EMBEDDED COMPONENT AND METHOD FOR MAKING SAME

BACKGROUND

To address quality assurance considerations and manufacturing considerations, a large integrated circuit component die may be split into multiple smaller pieces or die, often referred to as chiplets. The chiplets may be assembled on a multi-chip package (MCP) substrate. Via structures may be employed to electrically connect chiplets with embedded components in the MCP substrate. In a non-limiting example, an embedded bridge component may be implemented to electrically connect the chiplets together to achieve the functionality of the original integrated circuit component. The embedded bridge component may take the form of a small tile of silicon having fine-pitch copper interconnects, embedded in the MCP substrate layers.

BRIEF DESCRIPTION OF THE DRAWINGS

FIGS. 3A-4B are illustrations depicting features of the improved via structure for use with the embedded component, in accordance with various embodiments.

DETAILED DESCRIPTION

The following detailed description is merely exemplary in nature and is not intended to limit the application and uses. It may be evident that the novel embodiments can be practiced without every detail described herein. For the sake of brevity, well known structures and devices may be shown in block diagram form in order to facilitate a description thereof.

To address quality assurance considerations and manufacturing considerations, a large integrated circuit component die may be split into multiple smaller pieces or die, often referred to as chiplets, which are assembled on a multi-chip package (MCP) substrate. Via structures may be employed to electrically connect chiplets with embedded components in the MCP substrate. A non-limiting example is an embedded bridge component, taking the form of a small tile of silicon having fine-pitch copper interconnects embedded in the MCP substrate, may then be implemented to communicatively connect the chiplets together to achieve the functionality of the original integrated circuit component. These embedded components introduce a technical issue of scaling and translation to the MCP application. This is because the conductive via structures translate from the pitch and diameter requirements of a chiplet die bump on the surface of the MCP substrate to the pitch and diameter capability offered by the conductive contacts of the embedded component within the MCP substrate. Some available solutions employ ultra-violet (UV) laser drilling in the MCP substrate to create via structures with small via apertures to fill with a conductive material to connect the embedded bridge to the chiplets.

Unfortunately, the UV laser drilling approach has several technical challenges. First, creating a via with a diameter of less than about 20 microns is a technical problem to solve because the UV laser drilling is inherently limited to a UV wavelength of about 20 microns. Additionally, UV laser drilling has a limited accuracy due to the individual drilling of the UV laser vias, and a taper on the via wall that is introduced by the UV drilling process. Further, smaller via dimensions and better alignment will be required to meet the demands of next-generation bump pitch scaling.

Figures 2A, 2B:
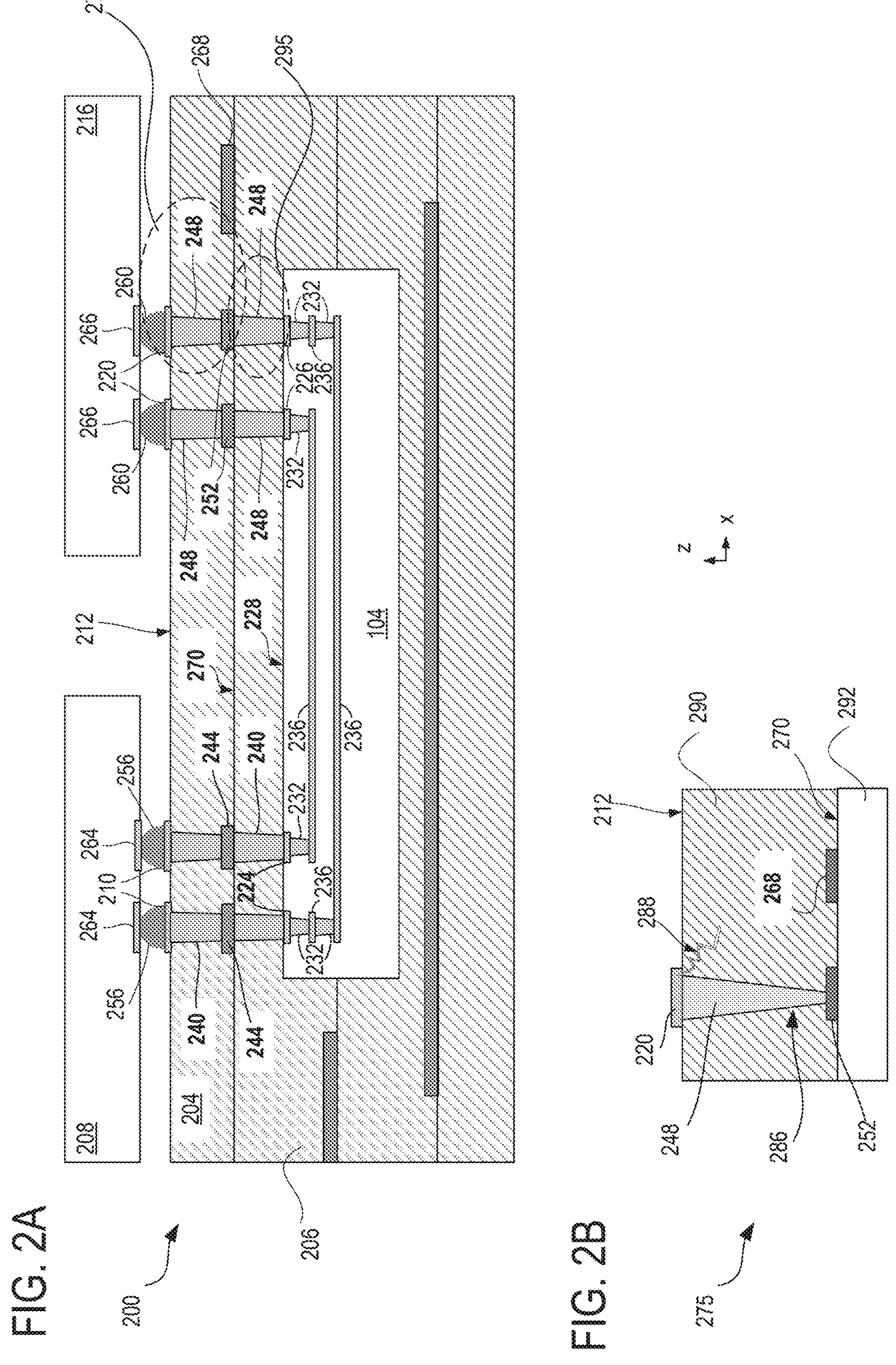
FIG. 2A is a cross-sectional illustration showing an example application of a bridge component embedded within a substrate component.
FIG. 2B is a cross-sectional illustration providing an enlarged view of a region of the substrate component of FIG. 2A that the present embodiments improve upon.

In another proposed solution, lithographically defined conductive vias (LIV) or pillars have been presented. The LIV approach deposits a conductive pillar and thereby enables smaller bump pitch scaling and better alignment than the UV laser approach. However, with the LIV approach, adjacent materials with mismatched coefficients of thermal expansion (CTE) can be vulnerable to stress. In particular, the CTE of the MCP substrate (which may be an organic dielectric) and the CTE of the chiplet or die attached thereto (e.g., the chiplet/die may be an inorganic material) may be mismatched. The stress from the CTE mismatch can lead to cracks in the MCP substrate (FIG. 2B illustrates a crack starting near a surface of a dielectric layer at a conductive contact and propagating down into the MCP substrate, toward a conductive trace). This CTE mismatch can introduce mechanical and electrical reliability issues to the MCP, as a result.

The present disclosure provides a technical solution to the above-described problems related to creating conductive via structures for applications using embedded components, in the form of a via structure for embedded component. Embodiments introduce coating conductive features (e.g., vias and pillars) in the MCP substrate with a thin film layer of a high hardness to function as an adhesion layer and a barrier to crack propagation.

Exemplary embodiments will hereinafter be described in conjunction with the following drawing figures, wherein like numerals denote like elements. Figures are not necessarily to scale but may be relied on for spatial orientation and relative positioning of features. As may be appreciated, certain terminology, such as "ceiling" and "floor", as well as "upper," "uppermost," "lower," "above," "below," "bottom," and "top" refer to directions based on viewing the Figures to which reference is made. Further, terms such as "front," "back," "rear," "side," "vertical," and "horizontal" may describe the orientation and/or location of portions of the component within a consistent but arbitrary frame of reference which is made clear by reference to the text and the associated Figures describing the component under discussion. Such terminology may include the words specifically mentioned above, derivatives thereof, and words of similar import.

As used herein, the term "adjacent" refers to layers or components that are in direct physical contact with each other, with no layers or components in between them. For example, a layer X that is adjacent to a layer Y refers to a layer that is in direct physical contact with layer Y. In contrast, as used herein, the phrase(s) "located on" (in the alternative, "located under," "located above/over," or "located next to," in the context of a first layer or component located on a second layer or component) includes (i) configurations in which the first layer or component is directly physically attached to the second layer (i.e., adjacent), and (ii) configurations in which the first layer or component is attached (e.g. coupled) to the second layer or component via one or more intervening layers or components.

The term "overlaid" (past participle of "overlay") may be used to refer to a layer to describe a location and orientation for the layer but does not imply a method for achieving the location and orientation. For example, a first layer overlaid on a second layer, or overlaid on a component means that the first layer is spread across or superimposed on the second layer or component. Accordingly, a layer that is overlaid on a second layer may be viewed in a cross-sectional view as adjacent to the second layer.

As used herein, the term "electronic component" can refer to an active electronic circuit (e.g., processing unit, memory, storage device, FET) or a passive electronic circuit (e.g., resistor, inductor, capacitor).

As used herein, the term "integrated circuit component" can refer to an electronic component configured on a semiconducting material to perform a function. An integrated circuit (IC) component can comprise one or more of any computing system components described or referenced herein or any other computing system component, such as a processor unit (e.g., system-on-a-chip (SoC), processor core, graphics processor unit (GPU), accelerator, chipset processor), I/O controller, memory, or network interface controller, and can comprise one or more additional active or passive devices such as capacitors, decoupling capacitors, resistors, inductors, fuses, diodes, transformers, sensors, electrostatic discharge (ESD) devices, and memory devices.

A non-limiting example of an unpackaged integrated circuit component includes a single monolithic integrated circuit die (shortened herein to "die"); the die may include solder bumps attached to contacts on the die. When present on the die, the solder bumps or other conductive contacts can enable the die to be directly attached to a printed circuit board (PCB).

A non-limiting example of a packaged integrated circuit component comprises one or more integrated circuit dies mounted on a package substrate with the integrated circuit dies and package substrate encapsulated in a casing material, such as a metal, plastic, glass, or ceramic. Often the casing includes an integrated heat spreader (IHS); the packaged integrated circuit component often has bumps or leads attached to the package substrate for attaching the packaged integrated circuit component to a printed circuit board or motherboard.

Figure 1:
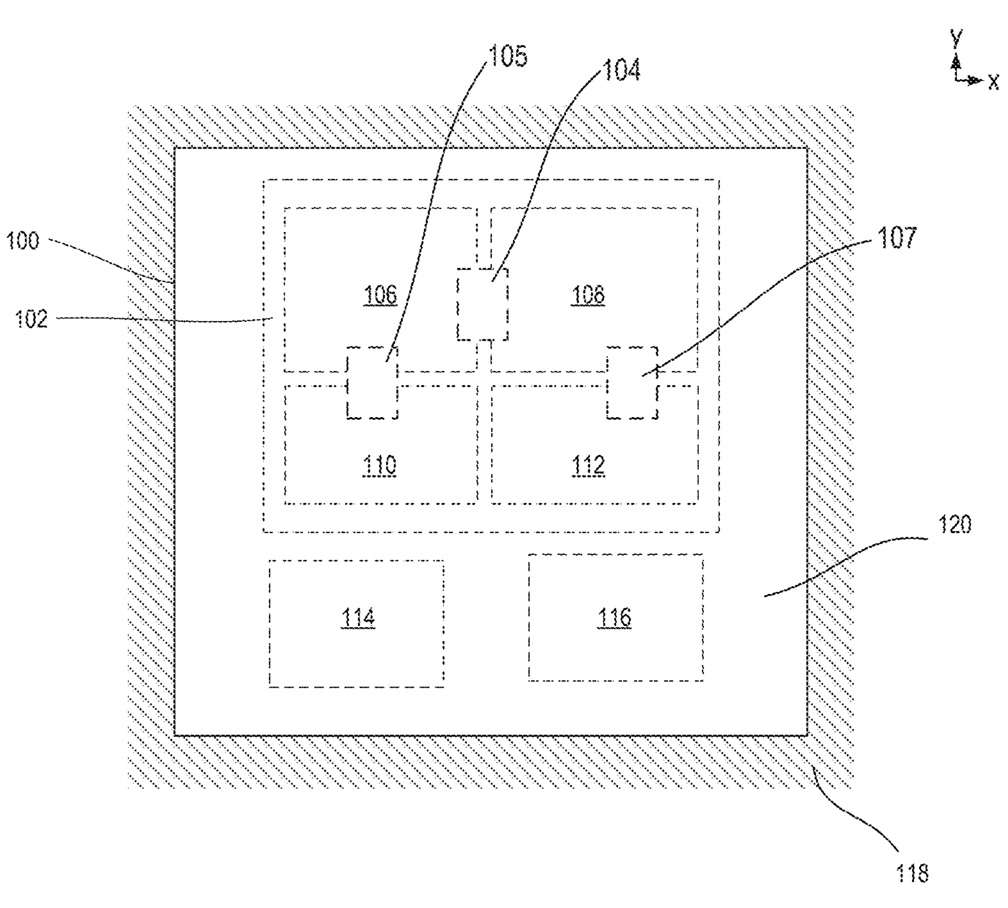
FIG. 1 illustrates an exemplary multi-chip package in which a bridge component is implemented, in accordance with various embodiments.

An example of an embedded component for which via structures are used is an embedded interconnect bridge. Generally, an embedded interconnect bridge, embedded bridge, or bridge component (shortened to "bridge" herein) is a small tile of silicon with fine-pitch copper interconnects, embedded in layers of a substrate, to facilitate communication between die or chiplets in an integrated circuit component. In FIG. 1, an integrated circuit component 100 may comprise an arrangement of multiple chiplets or integrated circuit dies 106, 108, 110, 112, attached to a substrate 102. Depending on the communication requirements between the chiplets, one or more bridges may be used. FIG. 1 depicts bridge 104, bridge 105, and bridge 107.

In various embodiments, the integrated circuit component 100 may be attached to a printed circuit board 118. In various embodiments, an encapsulant may encapsulate the arrangement of integrated circuit dies 106, 108, 110, and 112. The encapsulant 120 can comprise metal, ceramic, plastic, or a combination thereof. The integrated circuit component 100 can be communicatively coupled to one or more other components attached to the printed circuit board 118, such as another integrated circuit component (e.g., a memory, a processor unit, network interface controller, I/O controller) or any other processing device component (e.g., battery, antenna), as indicated with integrated circuit components 114 and 116. The integrated circuit 100 and the printed circuit board 118 can be located in a housing of an electronic device (e.g., FIG. 11, device 1100).

In the exemplary embodiment of FIG. 2A, some vias 248 (as well as vias 240) for use with embedded components are shown stacked (e.g., see, area 275 and area 295) within dielectric layers 206. FIG. 2A is a cross-sectional view 200 of a substrate component 204 having a bridge component (e.g., bridge 104) embedded within it. The substrate component 204 (which is analogous to the MCP substrate described above) comprises solder resist, or dielectric layers 206. A first integrated circuit die 208 is attached to a surface 212 of the substrate component 204 via coupling components 256 connecting to die conductive contacts 264 and substrate conductive contacts 210. A second integrated circuit die 216 is attached to the surface 212 via coupling components 260 connecting to die conductive contacts 266 and substrate conductive contacts 220.

Bridge conductive contacts 224 and 226 are located on a surface 228 of the bridge 104. In various embodiments, bridge conductive contacts 224 comprise copper. Bridge vias 232 and bridge conductive traces 236 may also be copper or another conductive material or metal and provide conductive pathways between the bridge conductive contacts 224 and 226. Substrate vias 240 and substrate conductive traces and contacts 244 provide conductive pathways from the substrate conductive contacts 210 to the bridge conductive contacts 224 and substrate vias 248 and substrate conductive traces and pads 252 provide conductive pathways from the substrate conductive contacts 220 to the bridge conductive contacts 226. Conductive traces 268 may also be implemented in a MCP for grounding or routing of other signals within the substrate. Together, conductive contacts 210, 220, 224, 226, vias 232, 240, 248, and conductive traces and contacts, 236, 244, 252 provide conductive pathways between integrated circuit dies 208 and 216 and thus allow them to be communicatively coupled.

Although the embedded bridge 104 is shown as being fully embedded within the substrate component 204, in some embodiments, it can be partially embedded, with the bridge surface 228 being part of the surface 212 of the substrate component 204. In such embodiments, the bridge conductive contacts 224 and 226 can be located at the surface 212 of the substrate component 204 and the integrated circuit dies 208 and 216 can connect to the bridge conductive contacts 224 and 226 via coupling components 256 and 260, respectively.

FIG. 2B enlarges an area around a via 248. The dielectric layers 206 are sorted into a first dielectric layer 290, in which the via 248 is located (laterally) and a second dielectric layer 292, that has a surface on which the via 248 is positioned vertically or perpendicularly. In a first example related to FIG. 2B, as indicated by area 275, the via 248 may be located (laterally) within a solder resist dielectric layer 290, having surface 212, and the via 248 may be positioned (vertically) on a surface 270 of a first build-up dielectric layer 292 (shortened herein to build-up layer and/or first dielectric layer). For this example, the function of the via 248 is to provide electrical connectivity from surface 212 to surface 270. In a second example related to FIG. 2B, as indicated by area 295, the via 248 may be located (laterally) within a build-up dielectric layer and the via 248 may be positioned (vertically) on the embedded bridge 104 (specifically, on an embedded bridge contact 226). For this example, the function of the via 248 is to provide electrical connectivity from the surface 270 to the embedded bridge contact 226.

Persons with skill in the art may appreciate that the distinctions in the dielectric layers 206 introduced in the FIG. 2B discussion have been introduced for illustrative purposes, however, in a cross-sectional image of an area surrounding the via 248, such as a transmission electron microscope (TEM), the material of 290 and 292 may be indistinguishable.

Returning to FIG. 2B, arrow 286 indicates a taper in the sidewall of the vias 248 (i.e., it has a larger opening at the surface 212 and a smaller opening as it travels downward). Although this figure is not drawn to scale, the relative relationships can be relied upon. While the figure is drawn in two dimensions, it may be appreciated that the taper extends around a vertical axis (the Z direction in the figure) of the via 248, radially, creating a three-dimensional volume. The taper is a characteristic generally resulting from employing ultra-violet (UV) laser drilling, from the surface 212, downward through the one or more dielectric layers 206, to create a space to be filled with a conductive material, becoming the via 248. The taper can be an offset from perpendicular (measured from the base or first dielectric layer or build-up layer 292) of more than 20%. This taper in the via structure can make the via 248 vulnerable to the CTE stress described above (e.g., when attached to the integrated circuit die 216 via coupling components 260). FIG. 2B illustrates a stress fracture 288 in the solder resist (SR) or dielectric layers 290, 292. The stress fracture 288 may undesirably travel through the solder resist or dielectric layers 290, 292 toward other conductive traces and contacts, and threaten the integrity of the conductive traces and contacts (e.g., conductive trace 268).

As may also be appreciated, in an application, there may be a plurality of vias (240 and 248) and any or all of the vias may have respective features and characteristics as described herein. Additionally, the same features and characteristics developed herein for the via 248 in area 275 apply to the via 248 in area 295, e.g., the via 248 has a base/narrower opening positioned on the bridge component 104 surface 228, and the via 248 top and wider opening is at surface 270.

Embodiments of the improved via structure for use with an embedded component are an enhancement to the substrate component 204, and specifically, to the structure of the via. FIGS. 3A-4B are illustrations depicting features of the improved via structure for use with the embedded component, in accordance with various embodiments. FIGS. 3A-4B also depict various stages in a method of manufacturing the improved via structure (as described in connection with FIG. 6). The structures in FIG. 3A-4B are each part of a substrate component, such as substrate component 204 of FIG. 2A. Consistent with the above, the improved via structure is positioned perpendicularly to a base or first dielectric layer or build-up layer, which may be an embedded component.

Figure 3A:
Figure 3A:
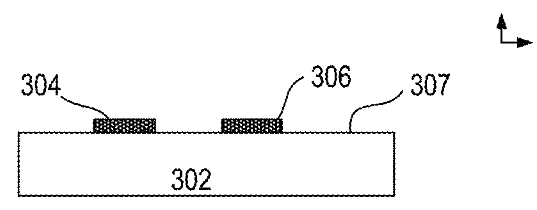
Figure 3B:
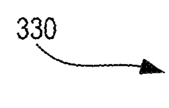
Figure 3B:
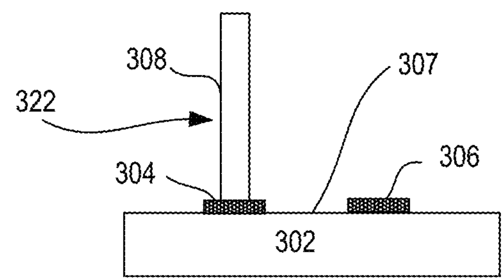

In FIG. 3A, a structure 300 is depicted, comprising a dielectric layer referred to as the base or build-up layer 302, having a surface metal layer deposited on surface 307. Depending on the application, the surface metal layer may form a conductive contact 304 or a conductive trace 306 (at FIG. 6, 602). In FIG. 3B, structure 330 illustrates build-up layer 302 with a pillar 308 (FIG. 6, 604) located on, and attached to, the build-up layer 302. The pillar 308 may be a Lithographically defined Via (LIV) and may comprise conductive material, such as copper, aluminum, or tungsten. In various embodiments, the pillar 308 has substantially straight perpendicular walls 322 and is substantially perpendicular to a surface of the embedded component (wherein substantially perpendicular means less than or equal to +/−20% from perpendicular). In various embodiments, a maximum diameter of the pillar 308 is less than 20 microns. These vias or pillars may be depositionally built or electroplated directly on the conductive contact 304 (as compared to UV lasered and filled), enabling more precision in the alignment of the pillar 308, specifically when the pillar 308/conductive contact 304 combination is to be aligned with a metal contact (not shown) in the base or build-up layer 302. This methodology enables a tighter pitch and scaling of the conductive contact 304 with neighbor conductive contacts 304, and hence, supports a tighter pitch of contacts on an embedded component.

Figure 3C:
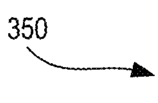
Figure 3C:
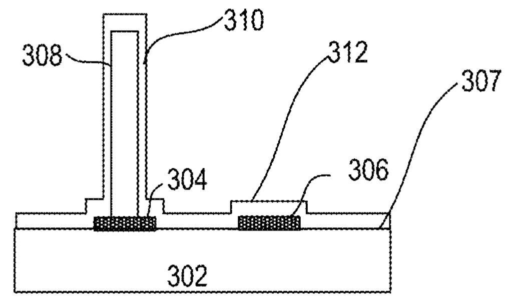
Figure 6:
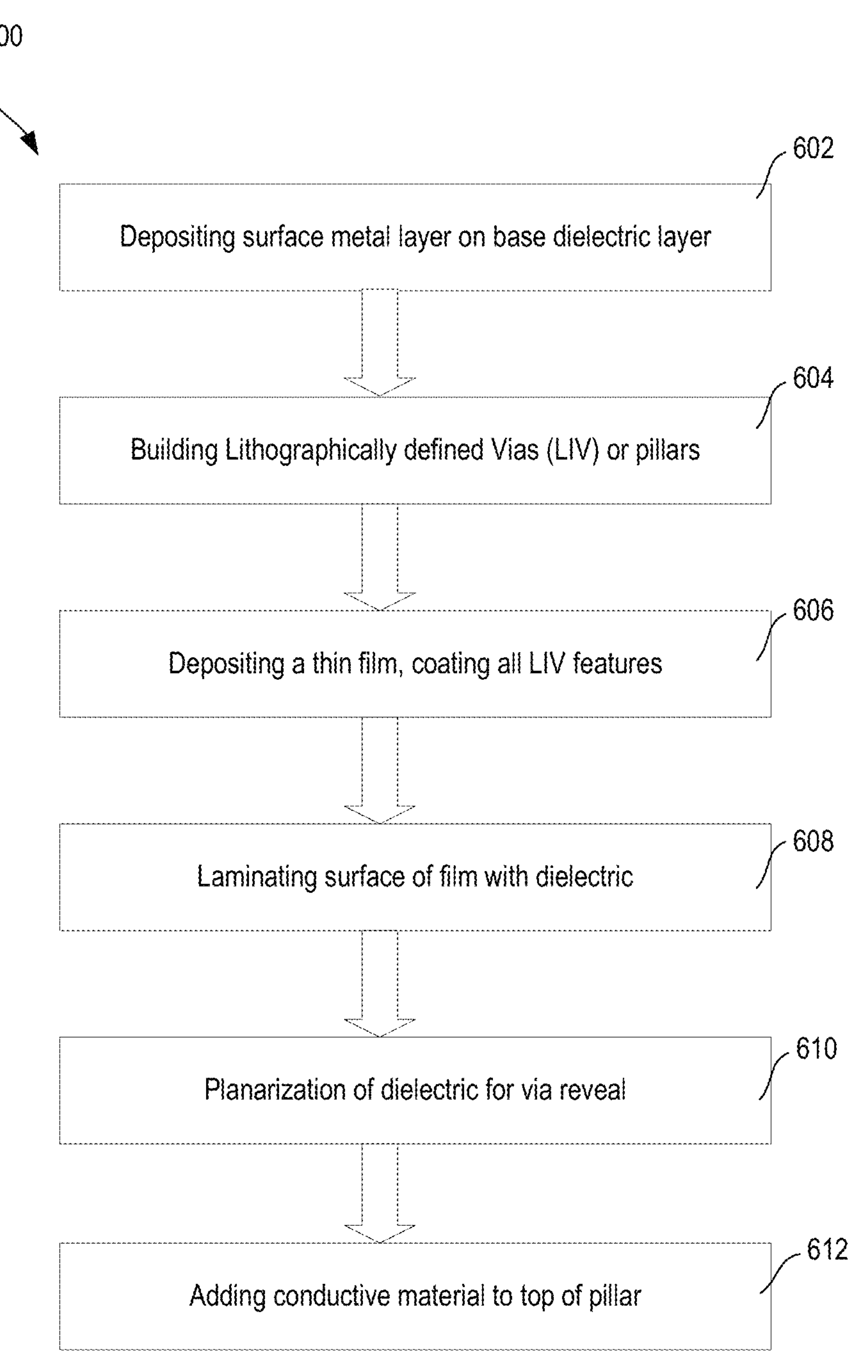
FIG. 6 is an exemplary method for making the improved via structure of FIG. 4B, in accordance with various embodiments.

In FIG. 3C, structure 350 illustrates a thin film (shortened herein to "film" 310 layer or second dielectric layer 310) located on the structure 330 (overlaid on the surface 307) and covering the at least one LIV pillar 308 (FIG. 6, 606). This film 310 is a thin film adhesion layer with a high hardness (as used herein, hardness of the thin film may depend on process conditions, but can be 10-30 GPa), selected to perform as a barrier to crack propagation (e.g., see stress fracture 288 illustrated in FIG. 2B).

In practice, and with reference to FIG. 2A, the pillar 308 may be one of a plurality of pillars built on a respective plurality of bridge conductive contacts on the bridge component, the plurality of pillars collectively called a feature landscape, having a variable profile when viewed in the cross-sectional views, such as FIG. 3B. As can be seen in FIG. 3C, the film 310 is conformally applied, and has a film surface 312 that retains the feature landscape profile and can act as a barrier to cracking because it is selected to have a higher hardness than the epoxy or solder resist making up the third dielectric layer 314 added in FIG. 3D (at 608). Non-limiting examples of materials that can be used for the film 310 include silicon and nitrogen, or silicon, nitrogen, and carbon, such as, SiNx, SiCxNy, and aluminum, such as, AlNx, AlOx. In various embodiments, some trace elements of C, N, H, or O may also be present in the thin film (e.g., in an SiNx film 310, there may be some H or C, etc. As used herein, "trace" means less than 2 percent. At the completion of applying the film 310, the LIV features are coated with the film 310. For step coverage discussion of the film 310, refer to FIG. 5.

Figure 3D:
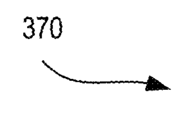
Figure 3D:
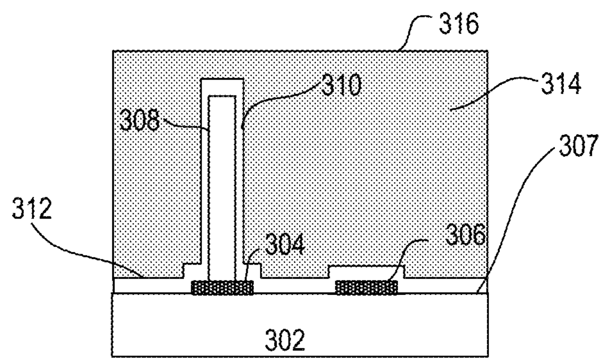

In FIG. 3D, structure 370 illustrates the structure 350 with its surface 312 laminated with a third dielectric layer 314 (FIG. 6, 608), the third dielectric layer 314 is sufficient to result in a dielectric surface 316 that obscures the feature landscape (i.e., the profile is obscured). In an embodiment, the third dielectric layer 314 comprises one or more dielectric layers that have been formed in various stages of manufacturing. In an embodiment, the third dielectric layer 314 is at least part of a substrate component or MCP substrate. In an embodiment, the third dielectric layer 314 may be an organic epoxy laminate. In various embodiments, the third dielectric layer 314 is overlaid or rolled over an arrangement of embedded components or bridges 104 in a substrate material, as in a sheet having a size of up to a half meter by a half meter.

Figures 4A, 4B:
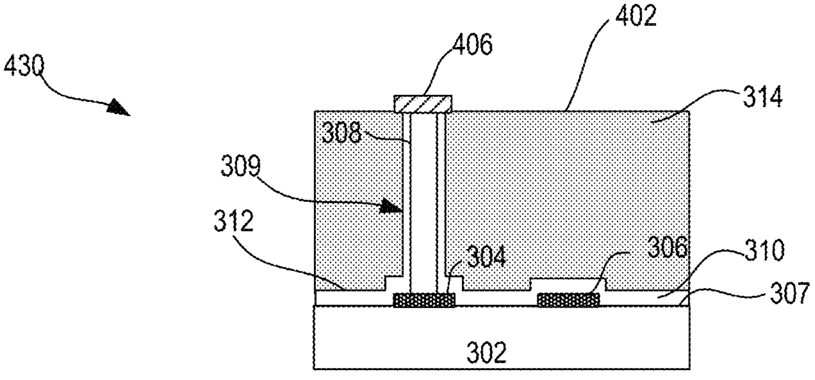

Turning to FIG. 4A, structure 400 illustrates the structure 370 in which the pillar has a top 404 that is exposed at a planarized upper dielectric surface 402. In practice, this may be achieved by planarizing the dielectric surface 316 (e.g., by etching or sanding) down to planarized surface 402, in which the film 310 has been removed to reveal the top 404 of pillar 306 (FIG. 6, 610). Structure 370 can also be described as having a film 310 between the third dielectric layer 314 and the build-up layer 302, the film 310 covering the sidewalls 309 of the pillar 306 (or, in various embodiments, between the third dielectric layer 314 and an embedded component), the pillar 306 providing an electrically conductive path from conductive contact 304 on the surface 307 to the planarized surface 402, and the pillar 306 having its sidewalls 309, but not top 404, covered by the film 310. The film 310 is removed from the top 404 of the pillar 306. By removing the film 310 from the top of the pillar 306, the electrical integrity of the pillar 306 is not adversely impacted. In FIG. 4B, structure 430 illustrates structure 400 with a conductive material 406 attached to the top 404 of the pillar 306 (FIG. 6, 612). In various embodiments, the conductive material 406 can be copper, nickel, tin, gold, or a combination thereof. In some embodiments, the conductive material 406 may be first level interconnect (FLI), used as an interconnect material within a substrate, analogous to contact 244 in FIG. 2A. In other embodiments, the conductive material 406 may represent a conductive contact, e.g., 220 of FIG. 2A.

FIG. 4B represents an exemplary improved via structure for use with an embedded component. In FIG. 4B, only one third dielectric layer 314 has been described, however, those with skill in the art will appreciate that the pillar 308 may be located laterally within multiple dielectric layers (e.g., dielectric layers 206 of a MCP substrate component 204).

Figure 5:
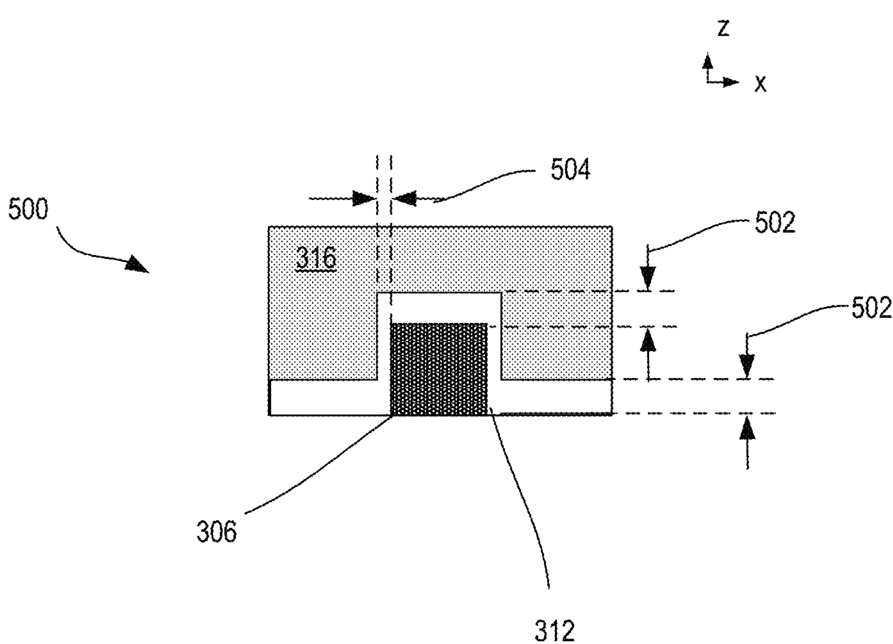
FIG. 5 is an enlarged cross-sectional view for discussion of the film coverage over conductive features, in accordance with various embodiments.

FIG. 5 is an enlarged cross-sectional view 500 of a conductive trace 306, for discussion of the film 312 coverage over conductive features, in accordance with various embodiments. The film 310, having been conformally deposited from above (in the Z direction in the illustration) over the features, may cover surfaces and the top of pillars and vias with more thickness than it covers sidewalls of features with. The film layer 310 can also be referred to as a second dielectric layer and may be characterized with features covering the top with a topcoat thickness 502 that is larger than a covering of the sidewalls, with a sidewall thickness 504. The topcoat thickness may be selected to be less than about 500 nanometers, and in a range of about 100 nanometers to about 500 nanometers. In an embodiment, the topcoat thickness 502 is about 290 nanometers and the sidewall thickness is about 160 nanometers, thus providing about a 55% step coverage. As used herein, "about" means plus or minus 5% from the referenced number. As may be appreciated, the topcoat thickness 502 is removed to expose the top 404 of a pillar 308 during planarization and reveal, but the sidewall thickness 504 remains on the sidewall 309 of the pillar 308 in the improved via structure. In contrast, the conductive trace 306 is protected by the topcoat thickness 502 and the sidewall thickness 504, even after the planarization and reveal at 610.

FIG. 6 is an exemplary method 600 for making the improved via structure of FIG. 4B, in accordance with various embodiments. The method begins with a substrate component comprising a build-up layer 302 with an upper surface 307, the substrate component may include an embedded component embedded in the substrate component below the upper dielectric surface, the embedded component may have a surface with a conductive contact. At 602, a surface metal layer may be deposited on the upper surface 307 of the build-up layer, creating or forming conductive contacts 304 and conductive traces 306. At 604, forming the lithographically defined vias (LIV) or pillars 308 may be achieved with electroplating on the conductive contacts 304. These LIV or pillars are understood to be of a conductive material, resulting in a landscape of conductive features. At 606 a thin film 310 is deposited over the surface 307, to cover the conductive features. The thin film 310 is applied with a step coverage of about 55% (wherein about 55% step coverage means 55% plus or minus 10%).

At 608, the surface 312, of the thin film layer 310 (i.e., the second dielectric layer), is laminated with a dielectric (i.e., the third dielectric layer, depicted in FIG. 3D). At 610, the surface 316 of the dielectric or MCP substrate, is planarized to remove the dielectric and the film 310 over the via, thereby revealing the top 404 of the via. At 610, in embodiments having a plurality of vias, the third dielectric layer and the film layer are removed from the plurality of vias, revealing a respective plurality of tops 404 (i.e., there is a one-to-one correspondence between vias and tops). At 612, with reference to FIG. 4B, a conductive material 406, such as first level interconnect (FLI), may be deposited on the top 404 of the exposed pillar 308. In various embodiments, at 612, depositing the conductive material on respective tops 404 is analogous to creating substrate bumps for further assembly. After 612, the chiplets may be conductively attached or bonded to the conductive material 406, for example, via thermal compression bonding between a chiplet/die bump and the substrate bump (conductive material 406). As may be appreciated, in practice, the embedded component may be an embedded bridge with a plurality of bridge conductive contacts, arranged to facilitate communication between two or more chiplets, and embodiments of the substrate component may have a respective plurality of pillars 308/310, each comprising conductive material perpendicularly attached to a respective bridge conductive contact. Additionally, in various embodiments, each pillar of the plurality of pillars may be exposed at the planarized upper dielectric surface, may have FLI attached thereto, and may be respectively compression bonded to a die bump of a chiplet.

Accordingly, various non-limiting embodiments of the via structure for embedded components have been described. The provided embodiments enable smaller pitches and more precise alignment of lithographic vias for use with bridge components. The provided embodiments also advantageously implement a high hardness barrier to crack propagation.

Figure 7:
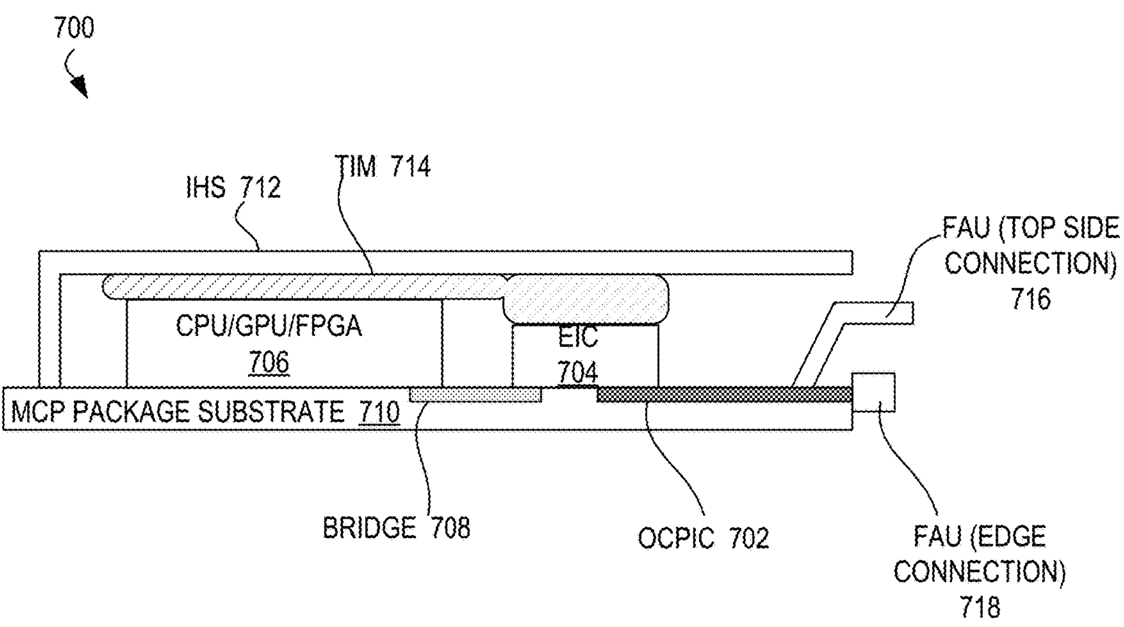
FIG. 7 is a simplified cross-sectional side view of a multi-chip package application that includes an embedded bridge, in accordance with various embodiments.

Turning now to FIG. 7, a non-limiting example embodiment illustrates the use of a bridge 708 in a substrate component having the improved via structure (e.g., structure

430), implemented in a photonic integrated circuit (PIC) application. A multi-die integrated circuit component can be referred to as a multi-chip package (MCP) or, alternatively, a multi-chip module (MCM). FIG. 7 is a simplified cross-sectional side view of an exemplary multi-chip package (MCP) 700 that includes chiplets, such as a PIC 702, and one or more processor units, CPUs, graphics processors, or FPGAs, as represented by electronic integrated circuit (EIC) 704, and integrated circuit 706. In addition, the MCP 700 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets," as described above.

In some embodiments, the PIC 702 chiplet is embedded in a MCP package substrate 710 (and the substrate of the PIC substrate is distinguished therefrom as PIC substrate, which may or may not be the same as the MCP package substrate). In other embodiments, the PIC 702 chiplet is attached to a MCP package substrate 710. The PIC 702 is adjacent to the EIC 704 that is configured specifically to receive and process data from the PIC 702. Bridge 708, embedded and implemented with the provided improved via structures in the MCP package substrate 710, conductively couples the integrated circuit 706 with the electronic integrated circuit 704.

A thermally conductive electrical interface material (TIM) 714 layer may be located over the integrated circuit 706 and the electronic integrated circuit 704. The TIM 714 can be any suitable material, such as a silver-particle filled thermal compound, thermal grease, phase change materials, indium foils or graphite sheets. An integrated heat spreader (IHS) 712, located on the TIM 714, covers the components of the MCP 700. In practice, the MCP 700, and the PIC 702 specifically, may communicate with other components in a device (e.g., device 1100, FIG. 11) via a fiber array unit (FAU) connector. In various embodiments, the FAU connector may be a top side connector 716, such as a grating coupler, or an edge connector 718, such as a micro-lens or V-groove.

Figure 8:
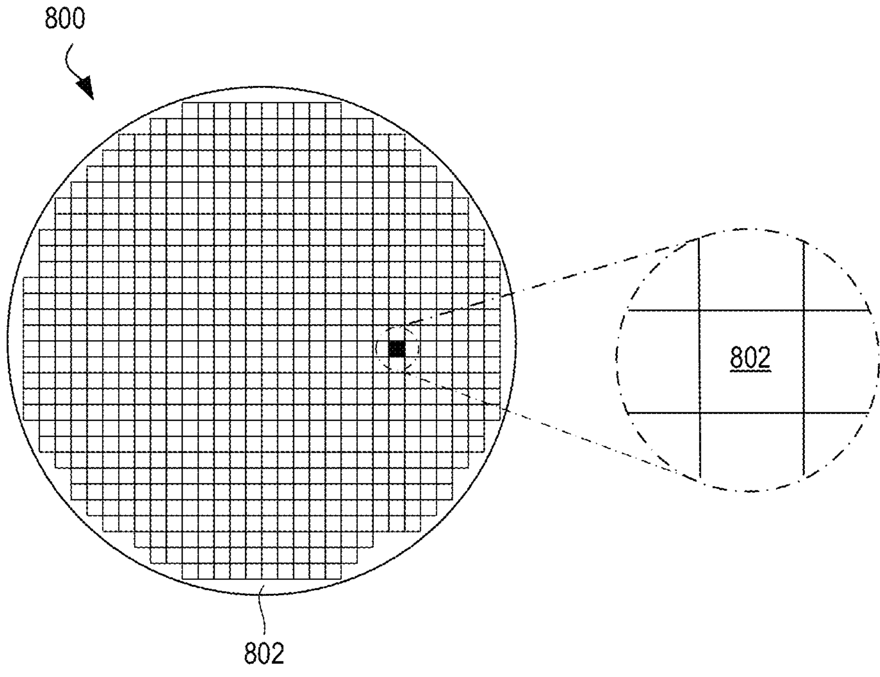
FIG. 8 is a top view of a wafer and dies that may be included in a microelectronic assembly, in accordance with any of the embodiments disclosed herein.

FIG. 8 is a top view of a wafer 800 and dies 802 that may be included in any of the embodiments disclosed herein. The wafer 800 may be composed of semiconductor material and may include one or more dies 802 formed on a surface of the wafer 800. After the fabrication of the integrated circuit components on the wafer 800 is complete, the wafer 800 may undergo a singulation process in which the dies 802 are separated from one another to provide discrete "chips" or destined for a packaged integrated circuit component. The individual dies 802, comprising an integrated circuit component, may include one or more transistors (e.g., some of the transistors 940 of FIG. 9, discussed below), supporting circuitry to route electrical signals to the transistors, passive components (e.g., signal traces, resistors, capacitors, or inductors), and/or any other integrated circuit components. In some embodiments, the wafer 800 or the die 802 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Additionally, multiple devices may be combined on a single die 802. For example, a memory array formed by multiple memory devices may be formed on a same die 802 as a processor unit (e.g., the processor unit 1102 of FIG. 11) or other logic that is configured to store information in the memory devices or execute instructions stored in the memory array. In some embodiments, a die 802 may be attached to a wafer 800 that includes other die, and the wafer 800 is subsequently singulated, this manufacturing procedure is referred to as a die-to-wafer assembly technique.

Figure 9:
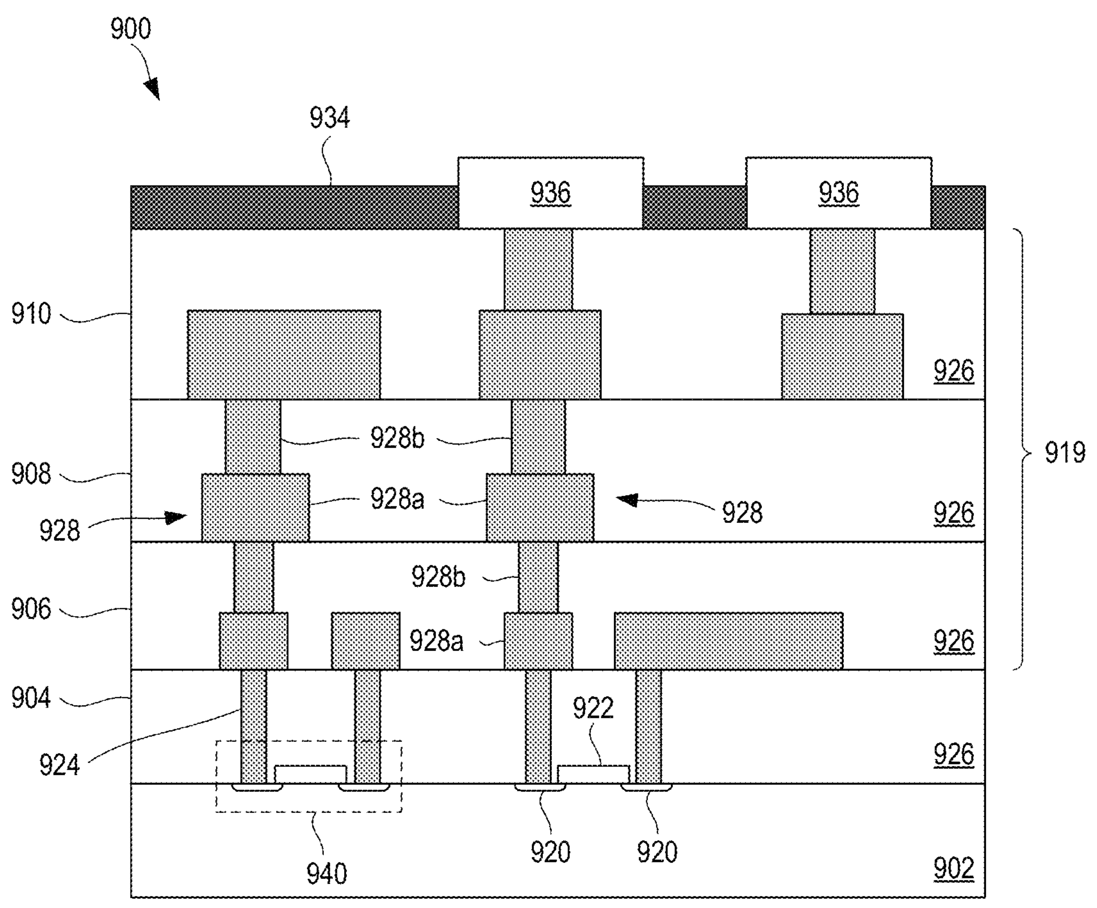
FIG. 9 is a simplified cross-sectional side view showing an implementation of an integrated circuit on a die that may be included in various embodiments, in accordance with any of the embodiments disclosed herein.

FIG. 9 is a cross-sectional side view of an integrated circuit 900 that may be included in any of the embodiments disclosed herein. One or more of the integrated circuits 900 may be included in one or more dies 802 (FIG. 8). The integrated circuit 900 may be formed on a die substrate 902 (e.g., the wafer 800 of FIG. 8) and may be included in a die (e.g., the die 802 of FIG. 8).

The die substrate 902 may be a semiconductor substrate composed of semiconductor material systems including, for example, n-type or p-type materials systems (or a combination of both). The die substrate 902 may include, for example, a crystalline substrate formed using a bulk silicon or a silicon-on-insulator (SOI) substructure. In some embodiments, the die substrate 902 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 902. Although a few examples of materials from which the die substrate 902 may be formed are described here, any material that may serve as a foundation for an integrated circuit 900 may be used. The die substrate 902 may be part of a singulated die (e.g., the dies 802 of FIG. 8) or a wafer (e.g., the wafer 800 of FIG. 8).

The integrated circuit 900 may include one or more device layers 904 disposed on the die substrate 902. The device layer 904 may include features of one or more transistors 940 (e.g., metal oxide semiconductor field-effect transistors (MOSFETs)) formed on the die substrate 902. The transistors 940 may include, for example, one or more source and/or drain (S/D) regions 920, a gate 922 to control current flow between the S/D regions 920, and one or more S/D contacts 924 to route electrical signals to/from the S/D regions 920.

The gate 922 may be formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be conducted on the gate dielectric to improve its quality when a high-k material is used.

The gate electrode may be formed on the gate dielectric and may include at least one p-type work function metal or n-type work function metal, depending on whether the transistor 940 is to be a p-type metal oxide semiconductor (PMOS) or an n-type metal oxide semiconductor (NMOS)

transistor. In some implementations, the gate electrode may comprise a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 940 along the source-channel-drain direction, the gate electrode may comprise a U-shaped structure that includes a bottom portion substantially parallel to the surface of the die substrate 902 and two sidewall portions that are substantially perpendicular to the top surface of the die substrate 902. In other embodiments, at least one of the metal layers that form the gate electrode may simply be a planar layer that is substantially parallel to the top surface of the die substrate 902 and does not include sidewall portions substantially perpendicular to the top surface of the die substrate 902. In other embodiments, the gate electrode may comprise a combination of U-shaped structures and planar, non-U-shaped structures. For example, the gate electrode may comprise one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 920 may be formed within the die substrate 902 adjacent to the gate 922 of individual transistors 940. The S/D regions 920 may be formed using an implantation/diffusion process or an etching/deposition process, for example. In the former process, dopants such as boron, aluminum, antimony, phosphorous, or arsenic may be ion-implanted into the die substrate 902 to form the S/D regions 920. An annealing process that activates the dopants and causes them to diffuse farther into the die substrate 902 may follow the ion-implantation process. In the latter process, the die substrate 902 may first be etched to form recesses at the locations of the S/D regions 920. An epitaxial deposition process may then be conducted to fill the recesses with material that is used to fabricate the S/D regions 920. In some implementations, the S/D regions 920 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 920 may be formed using one or more alternate semiconductor materials such as germanium or a group III-V material or alloy. In further embodiments, one or more layers of metal and/or metal alloys may be used to form the S/D regions 920.

Electrical signals, such as power and/or input/output (I/O) signals, may be routed to and/or from the devices (e.g., transistors 940) of the device layer 904 through one or more interconnect layers disposed on the device layer 904 (illustrated in FIG. 9 as interconnect layers 906-910). For example, electrically conductive features of the device layer 904 (e.g., the gate 922 and the S/D contacts 924) may be electrically coupled with the interconnect structures 928 of the interconnect layers 906-910. The one or more interconnect layers 906-910 may form a metallization stack (also referred to as an "ILD stack") 919 of the integrated circuit 900.

The interconnect structures 928 may be arranged within the interconnect layers 906-910 to route electrical signals according to a wide variety of designs; in particular, the arrangement is not limited to the particular configuration of interconnect structures 928 depicted in FIG. 9. Although a particular number of interconnect layers 906-910 is depicted in FIG. 9, embodiments of the present disclosure include integrated circuits having more or fewer interconnect layers than depicted.

In some embodiments, the interconnect structures 928 may include lines **928*a* and/or vias 928*b* filled with an electrically conductive material such as a metal. The lines 928*a* may be arranged to route electrical signals in a direction of a plane that is substantially parallel with a surface of the die substrate 902 upon which the device layer 904 is formed. For example, the lines 928*a* may route electrical signals in a direction in and out of the page and/or in a direction across the page. The vias 928*b* may be arranged to route electrical signals in a direction of a plane that is substantially perpendicular to the surface of the die substrate 902 upon which the device layer 904 is formed. In some embodiments, the vias 928*b* may electrically couple lines 928*a* of different interconnect layers 906-910** together.

The interconnect layers 906-910 may include a dielectric material 926 disposed between the interconnect structures 928, as shown in FIG. 9. In some embodiments, dielectric material 926 disposed between the interconnect structures 928 in different ones of the interconnect layers 906-910 may have different compositions; in other embodiments, the composition of the dielectric material 926 between different interconnect layers 906-910 may be the same. The device layer 904 may include a dielectric material 926 disposed between the transistors 940 and a bottom layer of the metallization stack as well. The dielectric material 926 included in the device layer 904 may have a different composition than the dielectric material 926 included in the interconnect layers 906-910; in other embodiments, the composition of the dielectric material 926 in the device layer 904 may be the same as a dielectric material 926 included in any one of the interconnect layers 906-910.

A first interconnect layer 906 (referred to as Metal 1 or "M1") may be formed directly on the device layer 904. In some embodiments, the first interconnect layer 906 may include lines **928*a* and/or vias 928*b*, as shown. The lines 928*a* of the first interconnect layer 906 may be coupled with contacts (e.g., the S/D contacts 924) of the device layer 904. The vias 928*b* of the first interconnect layer 906 may be coupled with the lines 928*a* of a second interconnect layer 908**.

The second interconnect layer 908 (referred to as Metal 2 or "M2") may be formed directly on the first interconnect layer 906. In some embodiments, the second interconnect layer 908 may include vias 928*b* to couple the lines 928*a* of the second interconnect layer 908 with the lines 928*a* of a third interconnect layer 910. Although the lines 928*a* and the vias 928*b* are structurally delineated with a line within individual interconnect layers for the sake of clarity, the lines 928*a* and the vias 928*b* may be structurally and/or materially contiguous (e.g., simultaneously filled during a dual-damascene process) in some embodiments.

The third interconnect layer 910 (referred to as Metal 3 or "M3") (and additional interconnect layers, as desired) may be formed in succession on the second interconnect layer 908 according to similar techniques and configurations described in connection with the second interconnect layer 908 or the first interconnect layer 906. In some embodiments, the interconnect layers that are "higher up" in the metallization stack 919 in the integrated circuit 900 (i.e., farther away from the device layer 904) may be thicker than the interconnect layers that are lower in the metallization stack 919, with lines 928*a* and vias 928*b* in the higher interconnect layers being thicker than those in the lower interconnect layers.

The integrated circuit 900 may include a solder resist material 934 (e.g., polyimide or similar material) and one or more conductive contacts 936 formed on the interconnect layers 906-910. In FIG. 9, the conductive contacts 936 are illustrated as taking the form of bond pads. The conductive contacts 936 may be electrically coupled with the interconnect structures 928 and configured to route the electrical signals of the transistor(s) 940 to external devices. For example, solder bonds may be formed on the one or more conductive contacts 936 to mechanically and/or electrically couple an integrated circuit die including the integrated circuit 900 with another component (e.g., a printed circuit board). The integrated circuit 900 may include additional or alternate structures to route the electrical signals from the interconnect layers 906-910; for example, the conductive contacts 936 may include other analogous features (e.g., posts) that route the electrical signals to external components.

In some embodiments in which the integrated circuit 900 is a double-sided die, the integrated circuit 900 may include another metallization stack (not shown) on the opposite side of the device layer(s) 904. This metallization stack may include multiple interconnect layers as discussed above with reference to the interconnect layers 906-910, to provide conductive pathways (e.g., including conductive lines and vias) between the device layer(s) 904 and additional conductive contacts (not shown) on the opposite side of the integrated circuit 900 from the conductive contacts 936.

In other embodiments in which the integrated circuit 900 is a double-sided die, the integrated circuit 900 may include one or more through silicon vias (TSVs) through the die substrate 902; these TSVs may make contact with the device layer(s) 904, and may provide conductive pathways between the device layer(s) 904 and additional conductive contacts (not shown) on the opposite side of the integrated circuit 900 from the conductive contacts 936. In some embodiments, TSVs extending through the substrate can be used for routing power and ground signals from conductive contacts on the opposite side of the integrated circuit 900 from the conductive contacts 936 to the transistors 940 and any other components integrated into the die 900, and the metallization stack 919 can be used to route I/O signals from the conductive contacts 936 to transistors 940 and any other components integrated into the die 900.

Multiple integrated circuits 900 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 10:
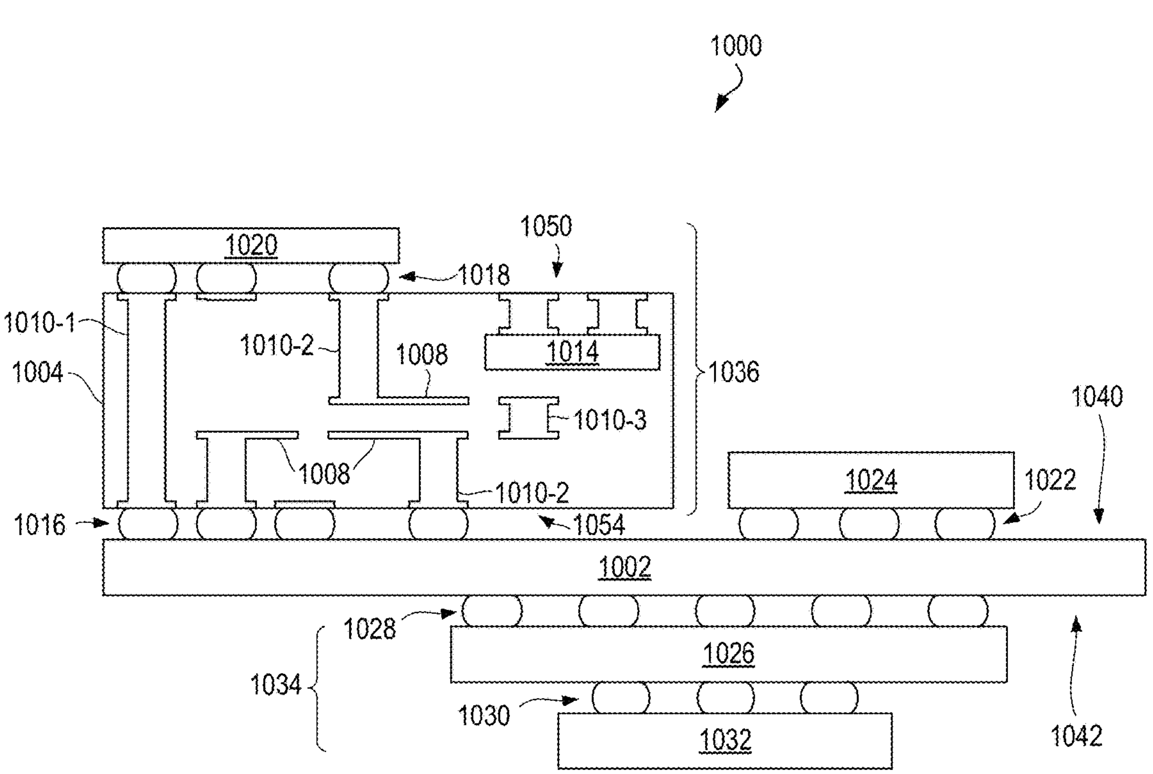
FIG. 10 is a cross-sectional side view of a microelectronic assembly that may include any of the embodiments disclosed herein.

FIG. 10 is a cross-sectional side view of a microelectronic assembly 1000 that may include any of the embodiments disclosed herein. The microelectronic assembly 1000 includes multiple integrated circuit components disposed on a circuit board 1002 (which may be a motherboard, system board, mainboard, etc.). The microelectronic assembly 1000 may include components disposed on a first face 1040 of the circuit board 1002 and an opposing second face 1042 of the circuit board 1002; generally, components may be disposed on one or both faces 1040 and 1042.

In some embodiments, the circuit board 1002 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1002. In other embodiments, the circuit board 1002 may be a non-PCB substrate. The microelectronic assembly 1000 illustrated in FIG. 10 includes a package-on-interposer structure 1036 coupled to the first face 1040 of the circuit board 1002 by coupling components 1016. The coupling components 1016 may electrically and mechanically couple the package-on-interposer structure 1036 to the circuit board 1002, and may include solder balls (as shown in FIG. 10), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1036 may include an integrated circuit component 1020 coupled to an interposer 1004 by coupling components 1018. The coupling components 1018 may take any suitable form for the application, such as the forms discussed above with reference to the coupling components 1016. Although a single integrated circuit component 1020 is shown in FIG. 10, multiple integrated circuit components may be coupled to the interposer 1004; indeed, additional interposers may be coupled to the interposer 1004. The interposer 1004 may provide an intervening substrate used to bridge the circuit board 1002 and the integrated circuit component 1020.

The integrated circuit component 1020 may be a packaged or unpackaged integrated circuit component that includes one or more integrated circuit dies (e.g., the die 802 of FIG. 8, the integrated circuit 900 of FIG. 9) and/or one or more other suitable components.

The unpackaged integrated circuit component 1020 comprises solder bumps attached to contacts on the die. The solder bumps allow the die to be directly attached to the interposer 1004. In embodiments where the integrated circuit component 1020 comprises multiple integrated circuit dies, the dies can be of the same type (a homogeneous multi-die integrated circuit component) or of two or more different types (a heterogeneous multi-die integrated circuit component). In addition to comprising one or more processor units, the integrated circuit component 1020 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof. A packaged multi-die integrated circuit component can be referred to as a multi-chip package (MCP) or multi-chip module (MCM).

Generally, the interposer 1004 may spread connections to a wider pitch or reroute a connection to a different connection. For example, the interposer 1004 may couple the integrated circuit component 1020 to a set of ball grid array (BGA) conductive contacts of the coupling components 1016 for coupling to the circuit board 1002. In the embodiment illustrated in FIG. 10, the integrated circuit component 1020 and the circuit board 1002 are attached to opposing sides of the interposer 1004; in other embodiments, the integrated circuit component 1020 and the circuit board 1002 may be attached to a same side of the interposer 1004. In some embodiments, three or more components may be interconnected by way of the interposer 1004.

In some embodiments, the interposer 1004 may be formed as a PCB, including multiple metal layers separated from one another by layers of dielectric material and interconnected by electrically conductive vias. In some embodiments, the interposer 1004 may be formed of an epoxy resin, a fiberglass-reinforced epoxy resin, an epoxy resin with inorganic fillers, a ceramic material, or a polymer material such as polyimide. In some embodiments, the interposer 1004 may be formed of alternate rigid or flexible materials that may include the same materials described above for use in a semiconductor substrate, such as silicon, germanium, and other group III-V and group IV materials. The interposer 1004 may include metal interconnects 1008 and vias 1010, including but not limited to through hole vias 1010-1 (that extend from a first face 1050 of the interposer 1004 to a second face 1054 of the interposer 1004), blind vias 1010-2 (that extend from the first or second faces 1050 or 1054 of the interposer 1004 to an internal metal layer), and buried vias 1010-3 (that connect internal metal layers).

In some embodiments, the interposer 1004 can comprise a silicon interposer. Through silicon vias (TSV) extending through the silicon interposer can connect connections on a first face of a silicon interposer to an opposing second face of the silicon interposer. In some embodiments, an interposer 1004 comprising a silicon interposer can further comprise one or more routing layers to route connections on a first face of the interposer 1004 to an opposing second face of the interposer 1004.

The interposer 1004 may further include embedded devices 1014, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1004. The package-on-interposer structure 1036 may take the form of any of the package-on-interposer structures known in the art. In embodiments where the interposer is a non-printed circuit board The integrated circuit assembly 1000 may include an integrated circuit component 1024 coupled to the first face 1040 of the circuit board 1002 by coupling components 1022. The coupling components 1022 may take the form of any of the embodiments discussed above with reference to the coupling components 1016, and the integrated circuit component 1024 may take the form of any of the embodiments discussed above with reference to the integrated circuit component 1020.

The integrated circuit assembly 1000 illustrated in FIG. 10 includes a package-on-package structure 1034 coupled to the second face 1042 of the circuit board 1002 by coupling components 1028. The package-on-package structure 1034 may include an integrated circuit component 1026 and an integrated circuit component 1032 coupled together by coupling components 1030 such that the integrated circuit component 1026 is disposed between the circuit board 1002 and the integrated circuit component 1032. The coupling components 1028 and 1030 may take the form of any of the embodiments of the coupling components 1016 discussed above, and the integrated circuit components 1026 and 1032 may take the form of any of the embodiments of the integrated circuit component 1020 discussed above. The package-on-package structure 1034 may be configured in accordance with any of the package-on-package structures known in the art.

Figure 11:
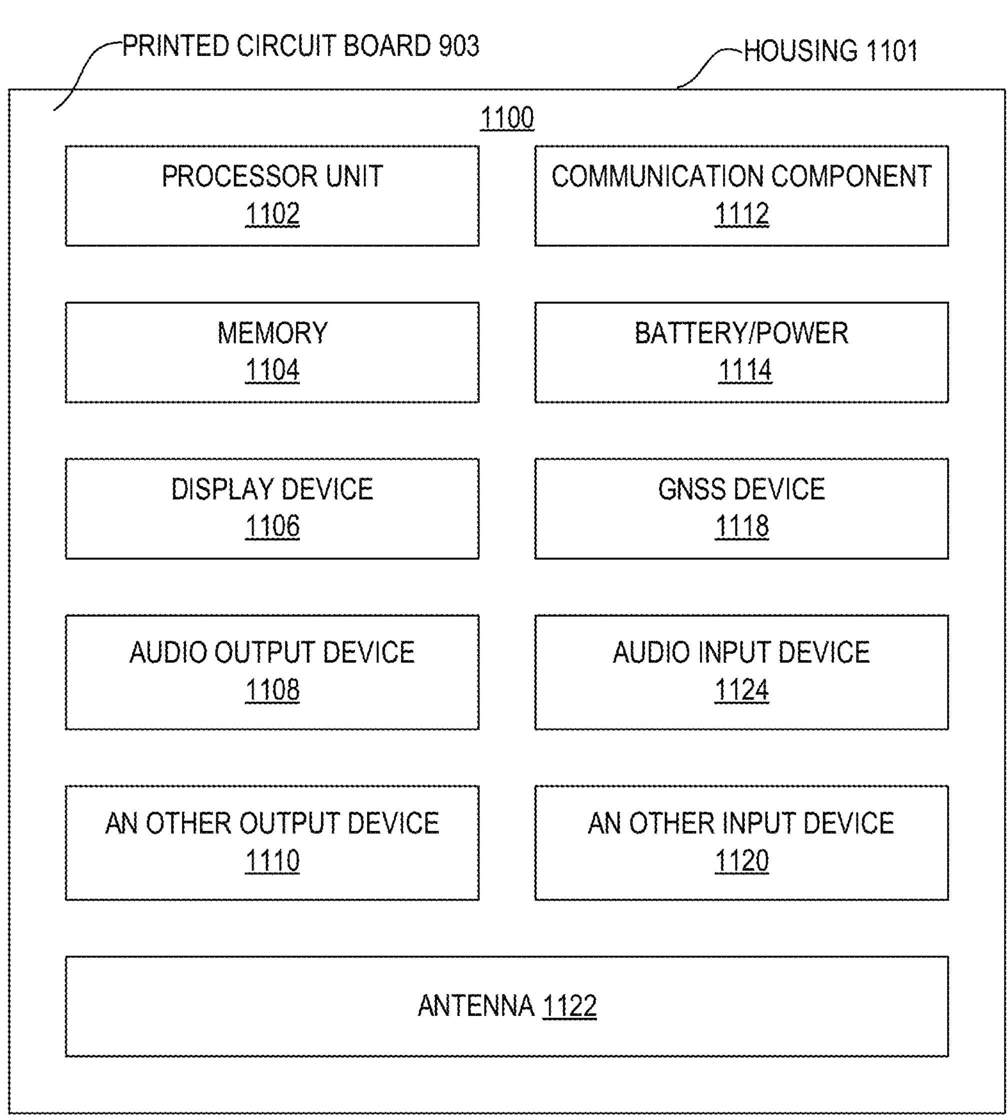
FIG. 11 is a block diagram of an example electrical device that may include any of the embodiments disclosed herein.

FIG. 11 is a block diagram of an example electrical device 1100 that may include one or more of the embodiments disclosed herein. For example, any suitable ones of the components of the electrical device 1100 may include one or more of the microelectronic assemblies 1000, integrated circuit components 1020, integrated circuits 900, integrated circuit dies 802, or structures disclosed herein. A number of components are illustrated in FIG. 11 as included in the electrical device 1100, but any one or more of these components may be omitted or duplicated, as suitable for the application. In some embodiments, some or all the components included in the electrical device 1100 may be attached to one or more motherboards, mainboards, printed circuit boards 903, or system boards. In some embodiments, one or more of these components are fabricated onto a single system-on-a-chip (SoC) die. In various embodiments, the electrical device 1100 is enclosed by, or integrated with, a housing 1101.

Additionally, in various embodiments, the electrical device 1100 may not include one or more of the components illustrated in FIG. 11, but the electrical device 1100 may include interface circuitry for coupling to the one or more components. For example, the electrical device 1100 may not include a display device 1106, but may include display device interface circuitry (e.g., a connector and driver circuitry) to which a display device 1106 may be coupled. In another set of examples, the electrical device 1100 may not include an audio input device 1124 or an audio output device 1108, but may include audio input or output device interface circuitry (e.g., connectors and supporting circuitry) to which an audio input device 1124 or audio output device 1108 may be coupled.

The electrical device 1100 may include one or more processor units 1102 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1102 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller crypto processors (specialized processors that execute cryptographic algorithms within hardware), server processors, controllers, or any other suitable type of processor units. As such, the processor unit can be referred to as an XPU (or xPU).

The electrical device 1100 may include a memory 1104, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1104 may include memory that is located on the same integrated circuit die as the processor unit 1102. This memory may be used as cache memory (e.g., Level 1 (L1), Level 2 (L2), Level 3 (L3), Level 4 (L4), Last Level Cache (LLC)) and may include embedded dynamic random-access memory (eDRAM) or spin transfer torque magnetic random-access memory (STT-MRAM).

In some embodiments, the electrical device 1100 can comprise one or more processor units 1102 that are heterogeneous or asymmetric to another processor unit 1102 in the electrical device 1100. There can be a variety of differences between the processor units 1102 in a system in terms of a spectrum of metrics of merit including architectural, microarchitectural, thermal, power consumption characteristics, and the like. These differences can effectively manifest themselves as asymmetry and heterogeneity among the processor units 1102 in the electrical device 1100.

In some embodiments, the electrical device 1100 may include a communication component 1112 (e.g., one or more communication components). For example, the communication component 1112 can manage wireless communications for the transfer of data to and from the electrical device 1100. The term "wireless" and its derivatives may be used to describe circuits, devices, systems, methods, techniques, communications channels, etc., that may communicate data using modulated electromagnetic radiation through a nonsolid medium. The term "wireless" does not imply that the associated devices do not contain any wires, although in some embodiments they might not.

The communication component 1112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1112 may operate in accordance with other wireless protocols in other embodiments. The electrical device 1100 may include an antenna 1122 to facilitate wireless communications and/or to receive other wireless communications (such as AM or FM radio transmissions).

In some embodiments, the communication component 1112 may manage wired communications, such as electrical, optical, or any other suitable communication protocols (e.g., IEEE 802.3 Ethernet standards). As noted above, the communication component 1112 may include multiple communication components. For instance, a first communication component 1112 may be dedicated to shorter-range wireless communications such as Wi-Fi or Bluetooth, and a second communication component 1112 may be dedicated to longer-range wireless communications such as global positioning system (GPS), EDGE, GPRS, CDMA, WiMAX, LTE, EV-DO, or others. In some embodiments, a first communication component 1112 may be dedicated to wireless communications, and a second communication component 1112 may be dedicated to wired communications.

The electrical device 1100 may include battery/power circuitry 1114. The battery/power circuitry 1114 may include one or more energy storage devices (e.g., batteries or capacitors) and/or circuitry for coupling components of the electrical device 1100 to an energy source separate from the electrical device 1100 (e.g., AC line power).

The electrical device 1100 may include a display device 1106 (or corresponding interface circuitry, as discussed above). The display device 1106 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1100 may include an audio output device 1108 (or corresponding interface circuitry, as discussed above). The audio output device 1108 may include any embedded or wired or wirelessly connected external device that generates an audible indicator, such as speakers, headsets, or earbuds.

The electrical device 1100 may include an audio input device 1124 (or corresponding interface circuitry, as discussed above). The audio input device 1124 may include any embedded or wired or wirelessly connected device that generates a signal representative of a sound, such as microphones, microphone arrays, or digital instruments (e.g., instruments having a musical instrument digital interface (MIDI) output). The electrical device 1100 may include a Global Navigation Satellite System (GNSS) device 1118 (or corresponding interface circuitry, as discussed above), such as a Global Positioning System (GPS) device. The GNSS device 1118 may be in communication with a satellite-based system and may determine a geolocation of the electrical device 1100 based on information received from one or more GNSS satellites, as known in the art.

The electrical device 1100 may include another output device 1110 (or corresponding interface circuitry, as discussed above). Examples of the other output device 1110 may include an audio codec, a video codec, a printer, a wired or wireless transmitter for providing information to other devices, or an additional storage device.

The electrical device 1100 may include another input device 1120 (or corresponding interface circuitry, as discussed above). Examples of the other input device 1120 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1100 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, a smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1100 may be any other electronic device that processes data. In some embodiments, the electrical device 1100 may comprise multiple discrete physical components. Given the range of devices that the electrical device 1100 can be manifested as in various embodiments, in some embodiments, the electrical device 1100 can be referred to as a computing device or a computing system.

Thus, embodiments of an improved via structure for use with the embedded component have been provided. The provided embodiments advantageously enable the use of finer pitch architectures and high-density input/output (I/O) designs in multi-chip packaging.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. Various changes can be made in the function and arrangement of elements without departing from the scope of the disclosure as set forth in the appended claims and the legal equivalents thereof.

As used herein, phrases such as "an embodiment," "various embodiments," "some embodiments," and the like, indicate that some embodiments may have some, all, or none of the features described for other embodiments. "First," "second," "third," and the like describe a common object and indicate different instances of like objects being referred to; unless specifically stated, they do not imply a given sequence, either temporally or spatially, in ranking, or any other manner. In accordance with patent application parlance, "connected" indicates elements that are in direct physical or electrical contact with each other and "coupled" indicates elements that co-operate or interact with each other, coupled elements may or may not be in direct physical or electrical contact. Furthermore, the terms "comprising," "including," "having," and the like, are utilized synonymously to denote non-exclusive inclusions.

As used in this application and the claims, a list of items joined by the term "at least one of" or the term "one or more of" can mean any combination of the listed terms. For example, the phrase "at least one of A, B or C" can mean A; B; C; A and B; A and C; B and C; or A, B, and C. Likewise, the phrase "one or more of A, B and C" can mean A; B; C; A and B; A and C; B and C; or A, B, and C.

As used in this application and the claims, the phrase "individual of" or "respective of" followed by a list of items recited or stated as having a trait, feature, etc. means that all of the items in the list possess the stated or recited trait, feature, etc. For example, the phrase "individual of A, B, or C, comprise a sidewall" or "respective of A, B, or C, comprise a sidewall" means that A comprises a sidewall, B comprises a sidewall, and C comprises a sidewall.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

EXAMPLES

Example 1 is a structure, comprising: a build-up dielectric layer having a surface; a pillar comprising conductive material substantially perpendicularly attached to the surface; a film layer located on the surface and covering sidewalls of the pillar; a dielectric layer located on the film layer, having an upper dielectric surface that is planar; and the pillar having a top that is exposed at the upper dielectric surface.

Example 2 includes the subject matter of Example 1, further comprising a conductive material attached to the top of the pillar.

Example 3 includes the subject matter of Example 1, wherein the structure is embedded in a substrate.

Example 4 includes the subject matter of Example 3, wherein the substrate comprises silicon.

Example 5 includes the subject matter of Example 1, wherein the pillar comprises copper.

Example 6 includes the subject matter of Example 1, wherein the build-up dielectric layer is a bridge component.

Example 7 includes the subject matter of Example 1, wherein the film layer covers the surface with a step coverage of about 55%.

Example 8 includes the subject matter of Example 1, wherein the film layer comprises silicon and nitrogen.

Example 9 includes the subject matter of Example 1, wherein the film layer comprises SiNx.

Example 10 includes the subject matter of Example 1, wherein the film layer comprises silicon, nitrogen, and carbon.

Example 11 includes the subject matter of Example 1, wherein the film layer comprises SiCxNy.

Example 12 includes the subject matter of Example 1, wherein the film layer comprises aluminum.

Example 13 includes the subject matter of Example 1, wherein the film layer comprises AlNx or AlOx.

Example 14 includes the subject matter of Example 1, wherein the film layer comprises SiNx and trace elements of C, N, H, or O.

Example 15 includes the subject matter of Example 1, wherein the film layer has a topcoat thickness of less than 500 nanometers.

Example 16 includes the subject matter of Example 1, wherein the film layer has a topcoat thickness of between 100 nanometers and 500 nanometers.

Example 17 includes the subject matter of Example 1, wherein the film layer has a sidewall thickness less than a topcoat thickness.

Example 18 includes the subject matter of Example 1, wherein the film layer has a sidewall thickness of about 160 nanometers and a topcoat thickness of about 290 nanometers.

Example 19 includes the subject matter of Example 1, wherein the dielectric layer includes an organic epoxy.

Example 20 includes the subject matter of Example 1, wherein the dielectric layer includes a solder resist material.

Example 21 includes the subject matter of Example 1, wherein the dielectric layer is part of a multi-chip package substrate.

Example 22 is a substrate component, comprising: a substrate comprising at least one dielectric layer and an upper surface; a bridge component within the substrate; a pillar within the substrate, comprising conductive material perpendicularly attached to the bridge component; the pillar having sidewalls and a top that is exposed at the upper surface; a film layer between the sidewalls of the pillar and the at least one dielectric layer; and an integrated circuit die located on the upper surface, conductively bonded to the top of the pillar.

Example 23 includes the subject matter of Example 22, wherein the integrated circuit die is a first integrated circuit die, and further comprising: a second pillar comprising conductive material perpendicularly attached to the bridge component; the second pillar having second sidewalls and a second top that is exposed at the upper surface; and a second integrated circuit die conductively bonded to the second top of the second pillar.

Example 24 includes the subject matter of Example 22, further comprising a conductive material attached to the top of the pillar.

Example 25 includes the subject matter of Example 22, wherein the substrate comprises silicon.

Example 26 includes the subject matter of Example 22, wherein the pillar comprises copper.

Example 27 includes the subject matter of Example 22, wherein the film layer covers the surface with a step coverage of about 55%.

Example 28 includes the subject matter of Example 22, wherein the film layer comprises silicon and nitrogen.

Example 29 includes the subject matter of Example 22, wherein the film layer comprises SiNx.

Example 30 includes the subject matter of Example 22, wherein the film layer comprises silicon, nitrogen, and carbon.

Example 31 includes the subject matter of Example 22, wherein the film layer comprises SiCxNy.

Example 32 includes the subject matter of Example 22, wherein the film layer comprises aluminum.

Example 33 includes the subject matter of Example 22, wherein the film layer comprises AlNx or AlOx.

Example 34 includes the subject matter of Example 22, wherein the film layer comprises SiNx and trace elements of C, N, H, or O.

Example 35 includes the subject matter of Example 22, wherein the film layer has a topcoat thickness of less than 500 nanometers.

Example 36 includes the subject matter of Example 22, wherein the film layer has a topcoat thickness of between 100 nanometers and 500 nanometers.

Example 37 includes the subject matter of Example 22, wherein the film layer has a sidewall thickness less than a topcoat thickness.

Example 38 includes the subject matter of Example 22, wherein the film layer has a sidewall thickness of about 160 nanometers and a topcoat thickness of about 290 nanometers.

Example 39 includes the subject matter of Example 22, wherein the dielectric layer includes an organic epoxy.

Example 40 includes the subject matter of Example 22, wherein the dielectric layer includes a solder resist material.

Example 41 includes the subject matter of Example 22, wherein the dielectric layer is part of a multi-chip package substrate.

Example 42 is a multi-chip package (MCP), comprising: a substrate comprising a dielectric layer with an upper dielectric surface; a bridge component embedded in the substrate below the upper dielectric surface, the bridge component having a surface with a bridge conductive contact; a pillar comprising conductive material perpendicularly attached to the bridge conductive contact, the pillar extending from the surface to the upper dielectric surface, and having a top that is exposed at the upper dielectric surface; a film layer located between the surface and the dielectric layer, the film layer covering sidewalls of the pillar; and an integrated circuit die located on the upper dielectric surface, conductively bonded to the top of the pillar.

Example 43 includes the subject matter of Example 42, wherein the bridge conductive contact is a first bridge conductive contact, the integrated circuit die is a first integrated circuit die, and further comprising: a second bridge conductive contact on the surface of the bridge component; a second pillar comprising conductive material perpendicularly attached to the second bridge conductive contact, the second pillar having a second top that is exposed at the upper dielectric surface; and a second integrated circuit die conductively bonded to the second top of the second pillar.

Example 44 includes the subject matter of Example 42, wherein the film layer covers the surface with a step coverage of about 55%.

Example 45 includes the subject matter of Example 42, wherein the film layer comprises silicon, nitrogen, or carbon.

Example 46 includes the subject matter of Example 42, wherein the film layer has a topcoat thickness of less than 500 nanometers.

Example 47 includes the subject matter of Example 42, wherein the film layer has a topcoat thickness of between 100 nanometers and 500 nanometers.

Example 48 includes the subject matter of Example 42, wherein the film layer has a sidewall thickness less than a topcoat thickness.

Example 49 includes the subject matter of Example 42, wherein the film layer has a sidewall thickness of about 160 nanometers and a topcoat thickness of about 290 nanometers.

Example 50 includes the subject matter of Example 42, wherein the dielectric layer is an organic epoxy.

Example 51 includes the subject matter of Example 42, wherein the dielectric layer is a solder-resist material.

Example 52 is a method for making a substrate component, comprising: depositing a conductive contact on a base dielectric layer with an upper surface; forming a pillar comprising conductive material on the conductive contact, such that the pillar is substantially perpendicular to the upper surface; forming a film layer over the pillar and the upper surface; laminating the film layer with a solder resist dielectric layer; and planarizing the solder resist dielectric layer to reveal a top of the pillar.

Example 53 includes the subject matter of Example 52, wherein forming the pillar is performed by lithographic deposition.

Example 54 includes the subject matter of Example 52, wherein forming the pillar is performed with electroplating.

Example 55 includes the subject matter of Example 52, wherein the pillar is one of a plurality of pillars formed on a respective plurality of conductive contacts, the plurality of pillars collectively called a feature landscape, and further comprising depositing the film conformally on the feature landscape.

Example 56 includes the subject matter of Example 52, wherein planarizing is performed by etching.

Example 57 includes the subject matter of Example 52, further comprising, adding a first level interconnect to the top of the pillar.

Example 58 includes the subject matter of Example 52, further comprising, adding a conductive material to the top of the pillar.

What is claimed is:

1. A structure, comprising:

a first dielectric layer having a surface;

a pillar comprising conductive material substantially perpendicular to the surface;

a second dielectric layer located on the surface and covering sidewalls of the pillar;

a third dielectric layer located on the second dielectric layer, the third dielectric layer having an upper surface; and the pillar having a top that is exposed at the upper surface of the third dielectric layer.

2. The structure of claim 1, further comprising a conductive material attached to the top of the pillar.

3. The structure of claim 1, wherein the structure is embedded in a substrate.

4. The structure of claim 3, wherein the substrate comprises silicon.

5. The structure of claim 1, wherein the pillar comprises copper.

6. The structure of claim 1, wherein the first dielectric layer is a bridge component or a dielectric layer.

7. The structure of claim 1, wherein the second dielectric layer covers the surface with a step coverage of about 55%.

8. The structure of claim 1, wherein the second dielectric layer comprises silicon and nitrogen.

9. The structure of claim 1, wherein the second dielectric layer comprises aluminum.

10. The structure of claim 1, wherein the second dielectric layer has a topcoat thickness of less than 500 nanometers, and a sidewall thickness that is less than the topcoat thickness.

11. A substrate component, comprising:

a substrate comprising at least one first dielectric layer and an upper surface;

a bridge component within the substrate;

a pillar within the substrate, comprising conductive material perpendicularly attached to the bridge component;

the pillar having sidewalls and a top that is exposed at the upper surface;

a second dielectric layer between the sidewalls of the pillar and the at least one first dielectric layer, the sidewalls substantially perpendicular to the upper surface; and an integrated circuit die located on the upper surface, conductively bonded to the top of the pillar.

12. The substrate component of claim 11, wherein the integrated circuit die is a first integrated circuit die, and further comprising:

a second pillar comprising conductive material perpendicularly attached to the bridge component;

the second pillar having second sidewalls and a second top that is exposed at the upper surface; and a second integrated circuit die conductively bonded to the second top of the second pillar.

13. The substrate component of claim 11, further comprising a conductive material attached to the top of the pillar.

14. The substrate component of claim 11, wherein the second dielectric layer covers the upper surface with a step coverage of about 55%.

15. The substrate component of claim 11, wherein the second dielectric layer comprises silicon and nitrogen.

16. The substrate component of claim 11, wherein the second dielectric layer has a topcoat thickness of less than 500 nanometers, and a sidewall thickness less than the topcoat thickness.

17. A multi-chip package (MCP), comprising:

a substrate comprising a first dielectric layer with an upper dielectric surface;

a bridge component embedded in the substrate below the upper dielectric surface, the bridge component having a surface with a bridge conductive contact;

a pillar comprising conductive material perpendicular to the bridge conductive contact, the pillar extending from the surface to the upper dielectric surface, and having a top that is exposed at the upper dielectric surface;

a second dielectric layer located between the surface and the first dielectric layer, the second dielectric layer covering sidewalls of the pillar; and an integrated circuit die located on the upper dielectric surface, conductively bonded to the top of the pillar.

18. The MCP of claim 17, wherein the bridge conductive contact is a first bridge conductive contact, the integrated circuit die is a first integrated circuit die, and further comprising:

a second bridge conductive contact on the surface of the bridge component;

a second pillar comprising conductive material perpendicular to the second bridge conductive contact, the second pillar having a second top that is exposed at the upper dielectric surface; and a second integrated circuit die conductively bonded to the second top of the second pillar.

19. The MCP of claim 17, wherein the second dielectric layer covers the surface with a step coverage of about 55%.

20. The MCP of claim 17, wherein the second dielectric layer has a topcoat thickness of less than 500 nanometers and a sidewall thickness less than the topcoat thickness.

21. A method for making a substrate component, comprising:

depositing a conductive contact on a first dielectric layer with an upper surface;

forming a pillar comprising conductive material on the conductive contact, such that the pillar is substantially perpendicular to the upper surface;

forming a second dielectric layer over the pillar and the upper surface;

laminating the second dielectric layer with a third dielectric layer; and planarizing the third dielectric layer to reveal a top of the pillar.

22. The method of claim 21, wherein forming the pillar is performed by lithographic deposition or electroplating.

23. The method of claim 21, wherein the pillar is one of a plurality of pillars formed on a respective plurality of conductive contacts, the plurality of pillars collectively called a feature landscape, and forming the second dielectric layer comprising forming the second dielectric layer conformally on the feature landscape.

24. The method of claim 21, further comprising, adding a first level interconnect to the top of the pillar.

25. The method of claim 21, further comprising, adding a conductive material to the top of the pillar.

* * * * *